US012729436B2

(12) United States Patent
Sekido

(10) Patent No.: US 12,729,436 B2
(45) Date of Patent: Sep. 8, 2026

(54) GAS SUPPLY AMOUNT CALCULATION METHOD AND SEMICONDUCTOR DEVICE MANUFACTURING METHOD

(71) Applicant: Tokyo Electron Limited, Tokyo (JP)

(72) Inventor: Kouichi Sekido, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 401 days.

(21) Appl. No.: 17/906,904

(22) PCT Filed: Mar. 16, 2021

(86) PCT No.: PCT/JP2021/010570
§ 371 (c)(1),
(2) Date: Sep. 21, 2022

(87) PCT Pub. No.: WO2021/193227
PCT Pub. Date: Sep. 30, 2021

(65) Prior Publication Data

US 2023/0129351 A1 Apr. 27, 2023

(30) Foreign Application Priority Data

Mar. 27, 2020 (JP) ................................ 2020-058325

(51) Int. Cl.
*C23C 16/455* (2006.01)
*C23C 16/52* (2006.01)

(52) U.S. Cl.
CPC ........ *C23C 16/45544* (2013.01); *C23C 16/52* (2013.01)

(58) Field of Classification Search
CPC .......... C23C 16/45561; C23C 16/4481; C23C 16/52; H01J 37/3244; H01J 37/32449
See application file for complete search history.

(56) References Cited

U.S. PATENT DOCUMENTS

2010/0062158 A1* 3/2010 Hara ...................... C23C 16/52 427/255.28
2010/0063753 A1* 3/2010 Bour ...................... C23C 16/52 73/1.06

(Continued)

FOREIGN PATENT DOCUMENTS

JP 2017-101295 A 6/2017
JP 2018-145458 A 9/2018

*Primary Examiner* — Joseph A Miller, Jr.
(74) *Attorney, Agent, or Firm* — Armstrong Teasdale LLP

(57) ABSTRACT

Gas supply amount calculation method includes: calculating flow rate of first substance gas by subtracting flow rate of second substance gas from flow rate of mixed gas of the first and second substance gas flowing through gas supply path connected to processing container configured to perform film formation by atomic layer deposition method; calculating first integrated flow rate of the first substance gas over time in remaining plurality of cycles after elapse of a predetermined number of cycles immediately after start of the film formation over a plurality of cycles; calculating average integrated flow rate per cycle by dividing the first integrated flow rate by the number of the remaining plurality of cycles; and calculating total supply amount of the first substance gas in the plurality of cycles by adding multiplication value obtained by multiplying the average integrated flow rate by the predetermined number and the first integrated flow rate.

5 Claims, 5 Drawing Sheets

(56) References Cited

U.S. PATENT DOCUMENTS

| | | | | |
|---|---|---|---|---|
| 2013/0092084 | A1* | 4/2013 | Shao | G01N 7/00<br>118/712 |
| 2020/0115801 | A1* | 4/2020 | Wakabayashi | C23C 16/4481 |

* cited by examiner

FIG. 1

Start
S11
Carrying in wafer
S12
Forming tungsten film
End

GAS SUPPLY AMOUNT CALCULATION METHOD AND SEMICONDUCTOR DEVICE MANUFACTURING METHOD

CROSS-REFERENCE TO RELATED APPLICATIONS

The present application is a U.S. National Stage Entry of International Patent Application No. PCT/JP2021/010570, filed Mar. 16, 2021, which claims the benefit of priority to Japanese Patent Application No. 2020-058325, filed Mar. 27, 2020, each of which is hereby incorporated herein by reference in its entirety.

TECHNICAL FIELD

The present disclosure relates to a gas supply amount calculation method and semiconductor device manufacturing method.

BACKGROUND

Patent Document 1 describes that a solid raw material or a liquid raw material in a raw material container is vaporized and supplied to a film-forming processor together with a carrier gas.

Patent Document 2 describes a gas supply apparatus, a gas supply method, and a film-forming method.

PRIOR ART DOCUMENTS

Patent Documents

Patent Document 1: Japanese Laid-Open Publication No. 2017-101295

Patent Document 2: Japanese Laid-Open Publication No. 2018-145458

The present disclosure provides a technology capable of accurately calculating an amount of gas supplied during film formation by an atomic layer deposition method.

SUMMARY

According to an aspect of the present disclosure, a gas supply amount calculation method includes: calculating a flow rate of a first substance gas by subtracting a flow rate of a second substance gas from a flow rate of a mixed gas of the first substance gas and the second substance gas flowing through a gas supply path connected to a processing container configured to perform film formation by an atomic layer deposition method; calculating a first integrated flow rate by integrating the calculated flow rate of the first substance gas over time in a remaining plurality of cycles after elapse of a predetermined number of cycles immediately after start of the film formation over a plurality of cycles by the atomic layer deposition method; calculating an average integrated flow rate per cycle by dividing the first integrated flow rate by the number of the remaining plurality of cycles; and calculating a total supply amount of the first substance gas in the plurality of cycles by the atomic layer deposition method by adding a multiplication value obtained by multiplying the average integrated flow rate by the predetermined number and the first integrated flow rate.

According to an aspect, a technology capable of accurately calculating an amount of gas supplied during film formation by an atomic layer deposition method is provided.

BRIEF DESCRIPTION OF DRAWINGS

FIG. 1 is a schematic cross-sectional view illustrating an example of a film-forming apparatus including a gas supply apparatus according to a present embodiment.

DETAILED DESCRIPTION

Figure 2:
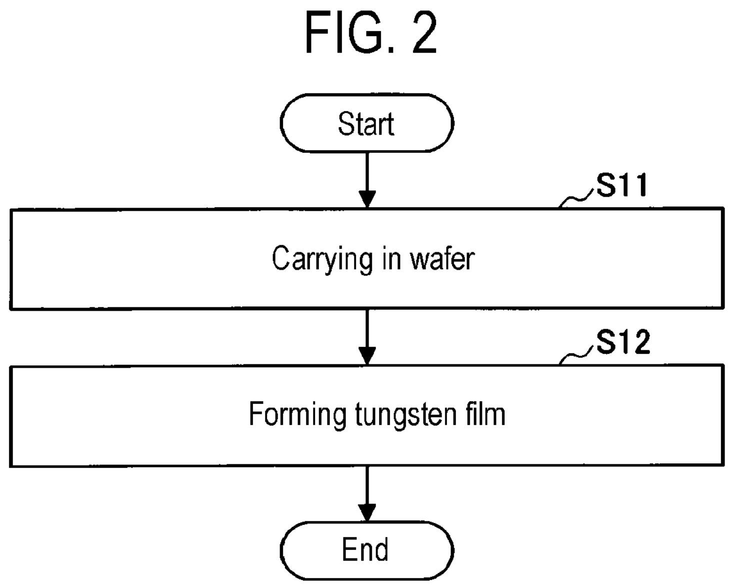
FIG. 2 is a flowchart illustrating an example of a film-forming method according to the present embodiment.

Hereinafter, embodiments for carrying out the present disclosure will be described with reference to drawings. In the specification and drawings, substantially the same components will be denoted by the same reference numerals, and redundant descriptions may be omitted.

<Film-Forming Apparatus>

Figure 1:
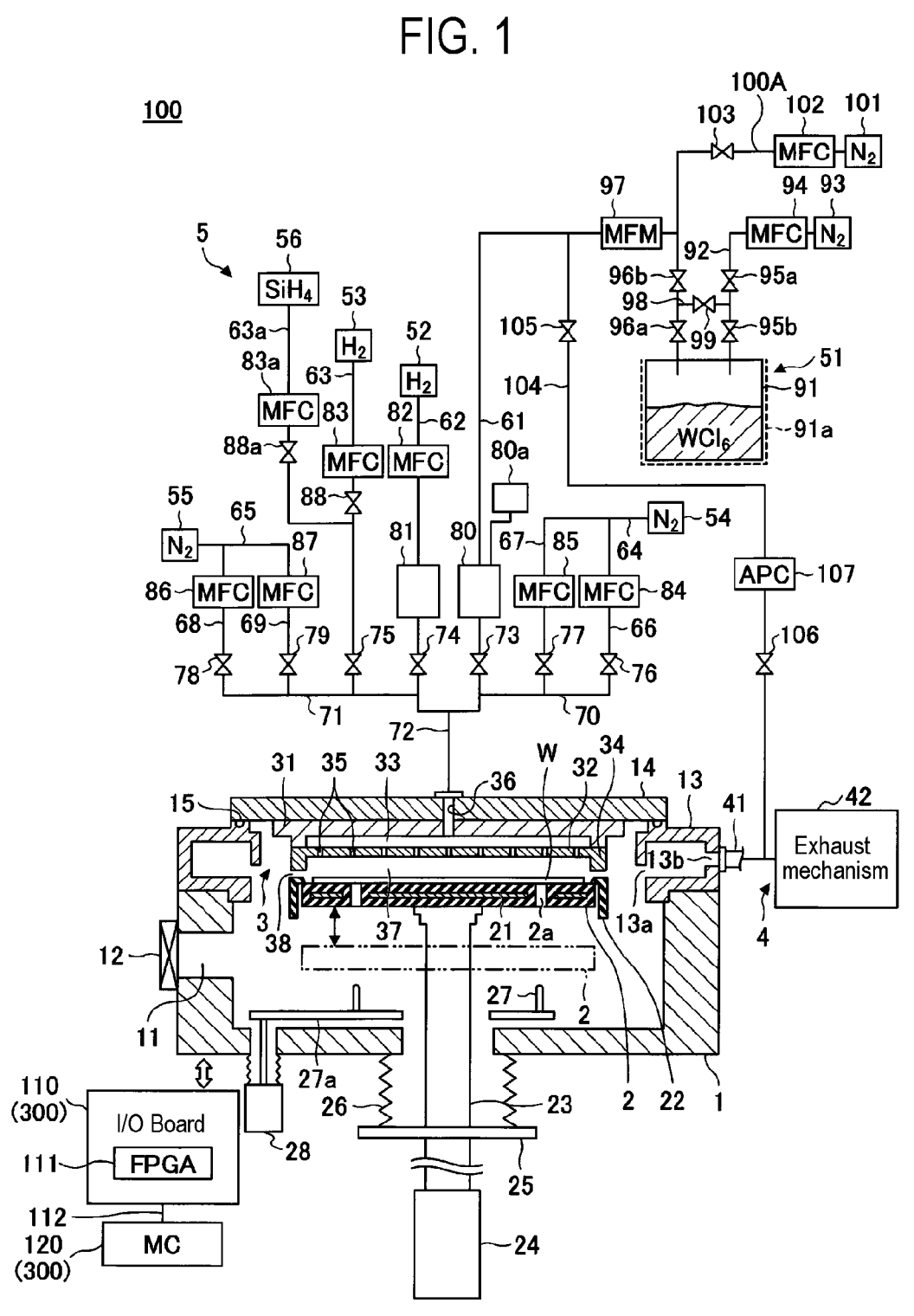

FIG. 1 is a schematic cross-sectional view illustrating an example of a film-forming apparatus 100 including a gas supply apparatus according to a present embodiment. The film-forming apparatus 100 according to the present embodiment is configured as an apparatus capable of forming a film by film formation by an atomic layer deposition (ALD) method.

The film-forming apparatus 100 includes a processing container 1, a susceptor 2 that horizontally supports a semiconductor wafer (hereinafter, simply referred to as a "wafer W") as a substrate in the processing container 1, a shower head 3 that supplies a processing gas into the processing container 1 in a shower shape, and an exhaust 4 that exhausts an interior of the processing container 1. The film-forming apparatus 100 further includes a processing gas supply mechanism 5 that supplies the processing gas to the shower head 3, and a controller 300. The controller 300 includes an input/output (I/O) board 110 and a module controller (MC) 120. Therefore, reference numeral 300 is written in parentheses for the I/O board 110 and the MC 120. The I/O board 110 is provided with a field programmable gate array (FPGA) 111. As an example, the I/O board 110 is connected to the MC 120 via a serial communication cable 112. The MC 120 controls each component of the film-forming apparatus 100 via the I/O board 110 and the FPGA 111.

Further, an equipment controller (EC) (not illustrated) is connected to the MC 120. The EC is a controller that comprehensively controls the film-forming apparatus 100, a film-forming apparatus other than the film-forming apparatus 100, and the like, and is located above the MC 120.

The processing container 1 is made of a metal such as aluminum, and has a substantially cylindrical shape. A carry-in/out port 11 configured to carry in or carry out a wafer W is formed in the side wall of the processing container 1, and the carry-in/out port 11 is configured to be opened/closed by a gate valve 12. An annular exhaust duct 13 having a rectangular cross section is provided at a main body of the processing container 1. A slit **13*a* is formed along an inner peripheral surface of the exhaust duct 13. Further, an exhaust port 13*b* is formed in an outer wall of the exhaust duct 13. On the top surface of the exhaust duct 13, a ceiling wall 14 is provided to close an upper opening of the processing container 1. The space between the ceiling wall 14 and the exhaust duct 13 is hermetically sealed with a seal ring 15**.

The susceptor 2 is formed in a disc shape having a size corresponding to the wafer W, and is supported by a support member 23. The susceptor 2 is made of a ceramic material such as aluminum nitride (AlN) or a metal material such as aluminum or a nickel-based alloy, and a heater 21 configured to heat the wafer W is embedded in the susceptor 2. The heater 21 generates heat by being fed with power from a heater power supply (not illustrated). The wafer W is controlled to a predetermined temperature by controlling an output of the heater 21 by a temperature signal of a thermocouple (not illustrated) provided in the vicinity of a wafer placement surface of the top surface of the susceptor 2.

The susceptor 2 is provided with a cover member 22 made of ceramics such as alumina to cover the outer peripheral region of the wafer placement surface and the side surface of the susceptor 2.

The support member 23, which supports the susceptor 2, extends to a lower side of the processing container 1 through a hole formed in a bottom wall of the processing container 1 from a center of a bottom surface of the susceptor 2, and a lower end of the support member 23 is connected to a lifting mechanism 24. By the lifting mechanism 24, the susceptor 2 is configured to be raised and lowered via the support member 23 between a processing position illustrated in FIG. 1 and a transport position (indicated by the alternated long and short dash line below the processing position) where the wafer is capable of being transported. Further, a flange 25 is provided at the support member 23 below the processing container 1, and a bellows 26, which partitions the atmosphere in the processing container 1 from the outside air, is provided between the bottom surface of the processing container 1 and the flange 25 to expand and contract in response to a lifting movement of the susceptor 2.

Three wafer support pins 27 (only two are illustrated) are provided to protrude upward from a lifting plate 27*a* in the vicinity of the bottom surface of the processing container 1. The wafer support pins 27 are configured to be raised and lowered via the lifting plate 27*a* by the lifting mechanism 28 provided below the processing container 1, and are inserted into through-holes 2*a* formed in the susceptor 2 located at the transport position to be capable of protruding or retracting with respect to the top surface of the susceptor 2. By raising and lowering the wafer support pins 27 in this manner, the wafer W is delivered between the wafer transport mechanism (not illustrated) and the susceptor 2.

The shower head 3 is made of a metal, is provided to face the susceptor 2, and has a diameter substantially equal to that of the susceptor 2. The shower head 3 includes a main body 31 fixed to the ceiling wall 14 of the processing container 1 and a shower plate 32 connected to the main body 31 from below. A gas diffusion space 33 is formed between the main body 31 and the shower plate 32, and a gas introduction hole 36 is provided through the centers of the body 31 and the ceiling wall 14 of the processing container 1 in the gas diffusion space 33. An annular protrusion 34 protruding downward is formed at the peripheral edge of the shower plate 32, and gas ejection holes 35 are formed in the flat surface inside the annular protrusion 34 of the shower plate 32.

In a state where the susceptor 2 is located at the processing position, a processing space 37 is formed between the shower plate 32 and the susceptor 2, and the annular protrusion 34 and the top surface of the cover member 22 of the susceptor 2 come close to each other to form an annular gap 38.

An exhaust 4 includes an exhaust pipe 41 connected to the exhaust port 13*b* in the exhaust duct 13, and an exhaust mechanism 42 connected to the exhaust pipe 41 and including a vacuum pump, a pressure control valve, or the like. During a process, the gas in the processing container 1 reaches the exhaust duct 13 via the slit 13*a*, and is exhausted from the exhaust duct 13 via the exhaust pipe 41 by the exhaust mechanism 42 of the exhaust 4.

The processing gas supply mechanism 5 includes a $WCl_6$-containing gas supply mechanism 51, a first $H_2$ gas source 52, a second $H_2$ gas source 53, a first $N_2$ gas source 54, a second $N_2$ gas source 55, and a $SiH_4$ gas source 56. The $WCl_6$-containing gas supply mechanism 51 supplies tungsten hexachloride ($WCl_6$) gas as a metal chloride gas which is a raw material gas. The first $H_2$ gas source 52 supplies hydrogen ($H_2$) gas as a reducing gas. The second $H_2$ gas source 53 supplies $H_2$ gas as an additive reducing gas. The first $N_2$ gas source 54 and the second $N_2$ gas source 55 supply nitrogen ($N_2$) gas which is a purge gas. The $SiH_4$ gas source 56 supplies silane ($SiH_4$) gas.

Further, the processing gas supply mechanism 5 includes a $WCl_6$-containing gas supply line 61, a first $H_2$ gas supply line 62, a second $H_2$ gas supply line 63, a first $N_2$ gas supply line 64, a second a $N_2$ gas supply line 65, and a $SiH_4$ gas supply line 63*a*. The $WCl_6$-containing gas supply line 61 is a line extending from the $WCl_6$-containing gas supply mechanism 51. The first $H_2$ gas supply line 62 is a line extending from the first $H_2$ gas source 52. The second $H_2$ gas supply line 63 is a line extending from the second $H_2$ gas source 53. The first $N_2$ gas supply line 64 is a line extending from the first $N_2$ gas source 54 and supplying $N_2$ gas to the $WCl_6$-containing gas supply line 61. The second $N_2$ gas supply line 65 is a line extending from the second $N_2$ gas source 55 and supplying $N_2$ gas to the first $H_2$ gas supply line 62. The $SiH_4$ gas supply line 63*a* is a line provided to extend from the $SiH_4$ gas source 56 and to be connected to the second $H_2$ gas supply line 63.

The first $N_2$ gas supply line 64 is branched into a first continuous $N_2$ gas supply line 66 that constantly supplies $N_2$ gas during film formation by an ALD method and a first flash purge line 67 that supplies $N_2$ gas only during the purge step. Further, the second $N_2$ gas supply line 65 is branched into a second continuous $N_2$ gas supply line 68 that constantly supplies $N_2$ gas during film formation by the ALD method and a second flash purge line 69 that supplies $N_2$ gas only during the purge step. The first continuous $N_2$ gas supply line 66 and the first flash purge line 67 are connected to a first connection line 70, and the first connection line 70 is connected to the $WCl_6$-containing gas supply line 61. Further, the second $H_2$ gas supply line 63, the second continuous $N_2$ gas supply line 68, and the second flash purge line 69 are connected to a second connection line 71, and the second connection line 71 is connected to the first $H_2$ gas supply line 62. The $WCl_6$-containing gas supply line 61 and the first $H_2$ gas supply line 62 are joined to a confluent pipe 72, and the confluent pipe 72 is connected to the gas introduction hole 36 described above.

On the most downstream sides of the $WCl_6$-containing gas supply line 61, the first $H_2$ gas supply line 62, the second $H_2$ gas supply line 63, the first continuous $N_2$ gas supply line 66, the first flash purge line 67, the second continuous $N_2$ gas supply line 68, and the second flash purge line 69, opening/closing valves 73, 74, 75, 76, 77, 78, and 79 configured to switch gases during the ALD are respectively provided. On the upstream sides of the opening/closing valves of the first $H_2$ gas supply line 62, the second $H_2$ gas supply line 63, the first continuous $N_2$ gas supply line 66, the first flash purge line 67, the second continuous $N_2$ gas supply line 68, and the second flash purge line 69, mass flow controllers (hereinafter, MFCs) 82, 83, 84, 85, 86, and 87 as flow rate controllers are respectively provided. The mass flow controller 83 is provided on the upstream side of the confluence of the $SiH_4$ gas supply line 63*a* in the second $H_2$ gas supply line 63, and an opening/closing valve 88 is provided between the mass flow controller 83 and the confluence. In addition, the $SiH_4$ gas supply line 63*a* is provided with an MFC 83*a* and an opening/closing valve 88*a* in this order from the upstream side. Therefore, it is possible to supply either or both of the $H_2$ gas and the $SiH_4$ gas via the second $H_2$ gas supply line 63. The $WCl_6$-containing gas supply line 61 and the first $H_2$ gas supply line 62 are provided with buffer tanks 80 and 81, respectively, such that the required gas may be supplied in a short time. The buffer tank 80 is provided with a pressure gauge 80*a* capable of detecting a pressure therein.

The $WCl_6$-containing gas supply mechanism 51 includes a film-forming raw material tank 91 which is a raw material container configured to accommodate $WCl_6$. The $WCl_6$ is a solid raw material that is solid at room temperature. A heater 91*a* is provided around the film-forming raw material tank 91 to heat the film-forming raw material in the film-forming raw material tank 91 at an appropriate temperature to sublimate $WCl_6$. The above-mentioned $WCl_6$-containing gas supply line 61 is inserted into the film-forming raw material tank 91 from above.

Further, the $WCl_6$-containing gas supply mechanism 51 includes: a carrier gas pipe 92 inserted into the film-forming raw material tank 91 from above; a carrier $N_2$ gas source 93 configured to supply $N_2$ gas as a carrier gas (carrier $N_2$ gas) to the carrier gas pipe 92; an MFC 94 as a flow controller and opening/closing valves 95*a* and 95*b* on the downstream side of the MFC 94, which are connected to the carrier gas pipe 92; and opening/closing valves 96*a* and 96*b* and a mass flow meter (hereinafter, MFM) 97 provided at the $WCl_6$-containing gas supply line 61 in the vicinity of the film-forming raw material tank 91. In the carrier gas pipe 92, the opening/closing valve 95*a* is provided at a position directly below the MFC 94, and the opening/closing valve 95*b* is provided near an insertion end of the carrier gas pipe 92. Further, the opening/closing valves 96*a* and 96*b* and the MFM 97 are arranged in the order of the opening/closing valve 96*a*, the opening/closing valve 96*b*, and the MFM 97 from an insertion end of the $WCl_6$-containing gas supply line 61.

The $WCl_6$-containing gas supply line is an example of the first flow path. The MFM 97 is an example of the first flow meter. The carrier gas pipe 92 is an example of the second flow path. The MFC 94 is an example of the second flow meter.

A bypass pipe 98 is provided to interconnect a position between the opening/closing valve 95*a* and the opening/closing valve 95*b* of the carrier gas pipe 92 and a position between the opening/closing valve 96*a* and the opening/closing valve 96*b* of the $WCl_6$-containing gas supply line 61, and an opening/closing valve 99 is interposed in the bypass pipe 98. By closing the opening/closing valves 95*b* and 96*a* and opening the opening/closing valves 99, 95*a*, and 96*b*, the carrier $N_2$ gas supplied from the carrier $N_2$ gas source 93 is supplied to the $WCl_6$-containing gas supply line 61 via the carrier gas pipe 92 and the bypass pipe 98. This makes it possible to purge the $WCl_6$-containing gas supply line 61.

Further, a downstream end of a dilution $N_2$ gas supply line 100A configured to supply dilution $N_2$ gas, which is a dilution gas, is joined to the upstream side of the MFM 97 in the $WCl_6$-containing gas supply line 61. A dilution $N_2$ gas source 101, which is a source of the dilution $N_2$ gas, is provided at an upstream end of the dilution $N_2$ gas supply line 100A. An MFC 102 and an opening/closing valve 103 are interposed in the dilution $N_2$ gas supply line 100A from the upstream side.

The dilution $N_2$ gas supply line 100A is an example of the second flow path. The MFC 102 is an example of the second flow meter.

One end of an evacuation line 104 is connected to a downstream position of the MFM 97 in the $WCl_6$-containing gas supply line 61, and the other end of the evacuation line 104 is connected to the exhaust pipe 41. An opening/closing valve 105 and an opening/closing valve 106 are provided at a position of the evacuation line 104 near the $WCl_6$-containing gas supply line 61 and a position of the evacuation line 104 near the exhaust pipe 41, respectively. Further, a pressure control valve 107 is provided between the opening/closing valve 105 and the opening/closing valve 106. By opening the opening/closing valves 105, 106, 96*a*, and 96*b* in a state where the opening/closing valves 99, 95*a*, and 95*b* are closed, it is possible to exhaust an interior of the film-forming raw material tank 91 and an interior of the buffer tank 80 by the exhaust mechanism 42.

The MFM 97 measures an instantaneous mass flow rate of a mixed gas of $WCl_6$ gas, carrier $N_2$ gas, and dilution $N_2$ gas at each sampling cycle (e.g., 100 milliseconds). The sampling cycle of the MFM 97 is not limited to 100 milliseconds, and may be set to an appropriate value of, for example, 50 milliseconds to 200 milliseconds. Likewise, the MFCs 82, 83, 83*a*, 84, 85, 86, 87, 94, and 102 also measure instantaneous mass flow rates in such a sampling cycle.

The mixed gas of $WCl_6$ gas, carrier $N_2$ gas, and dilution $N_2$ gas is supplied into the processing space 37 of the processing container 1 by closing the opening/closing valve 99, opening the opening/closing valves 95*a*, 95*b*, 96*a*, 96*b*, and 103, and further opening the opening/closing valve 73 when the film-forming apparatus 100 forms a tungsten film on the surface of a wafer W. The $WCl_6$ gas is an example of the first substance gas for which the total supply amount is calculated by the gas supply amount calculation method of the present embodiment. The carrier $N_2$ gas and the dilution $N_2$ gas are examples of the second substance gas for which the total supply amount is not calculated by the gas supply amount calculation method of the present embodiment.

For example, only carrier $N_2$ gas flows through the MFC 94. In other words, only the $N_2$ gas, which is the second substance gas, flows through the MFC 94, which is the second flow meter.

For example, an entire amount of the carrier gas $N_2$ gas flowing through the MFC 94 via the bypass pipe 98 or the film-forming raw material tank 91 flows into the MFM 97. In other words, for example, the entire amount of the $N_2$ gas, which is the second substance gas flowing through the MFC 94 which is the second flow meter, flows into the MFM 97 which is the first flow meter.

For example, only the dilution $N_2$ gas flows through the MFC 102. In other words, only the $N_2$ gas, which is the second substance gas, flows through the MFC 102 which is the second flow meter.

For example, an entire amount of the dilution $N_2$ gas flowing through MFC 102 flows into the MFM 97. In other words, for example, the entire amount of the $N_2$ gas, which is the second substance gas flowing through the MFC 102 which is the second flow meter, flows into the MFM 97 which is the first flow meter.

The MFM 97 is calibrated based on, for example, pure $N_2$ gas. When the pure $N_2$ gas is caused to flow through a mass flow meter calibrated based on the pure $N_2$ gas, the mass flow meter measures and outputs a correct instantaneous mass flow rate of $N_2$ gas. A unit of the instantaneous mass flow rate measured by the MFM 97 is, for example, standard cubic centimeters per minute (SCCM).

The MFC 94 and the MFC 102 are calibrated based on, for example, the pure $N_2$ gas. When the pure $N_2$ gas is caused to flow through a mass flow controller calibrated based on the pure $N_2$ gas, the mass flow controller measures and outputs the correct instantaneous mass flow rate of $N_2$ gas. The unit of the instantaneous mass flow rate measured by the MFC 94 and the MFC 102 is, for example, standard cubic centimeters per minute (SCCM).

The I/O board 110 is an input/output interface configured to input/output various data, control commands, or the like among the MFCs 82, 83, 83*a*, 84, 85, 86, 87, 94, and 102, the MFM 97, and the like and the MC 120. The I/O board 110 is provided with an FPGA 111. Although the I/O board 110 is also provided with electronic components other than the FPGA 111, the FPGA 111 will be described here while omitting description of components other than the FPGA 111.

A process performed by the FPGA 111 is, for example, to acquire the flow rate values measured by the MFCs 82, 83, 83*a*, 84, 85, 86, 87, 94, 102, and the MFM 97 and transmit the values to the MC 120.

Another process performed by FPGA 111 is, for example, as follows. The FPGA 111 calculates the instantaneous mass flow rate of $WCl_6$ gas by subtracting a measured flow rate value (unit: SCCM) of carrier $N_2$ gas acquired from the MFC 94 and a measured flow rate value (unit: SCCM) of dilution $N_2$ gas acquired from the MFC 102, from a measured flow rate value (unit: SCCM) of a mixed gas of $WCl_6$ gas, carrier $N_2$ gas, and dilution $N_2$ gas, which is acquired from the MFM 97. The unit of the calculated instantaneous mass flow rate of $WCl_6$ gas is SCCM.

Next, the FPGA 111 converts the flow rate of the $WCl_6$ gas in SCCM into a value in mg/min by using Equation 1 below.

$$\text{Flow rate of } WCl_6 \text{ gas (mg/min)} = \text{Flow rate of } WCl_6 \text{ gas } (SCCM) \times 0.2 \text{ (conversion factor)} / 22{,}400 \times 396.6 \text{ (molar mass of } WCl_6) \times 1{,}000 \quad \text{(Equation 1)}$$

In Equation 1, 22,400 (cc/mol) is a volume of 1 mol of gas in the standard state. In Equation 1, the molar mass of $WCl_6$ is the mass of 1 mol of $WCl_6$, which is 396.6 (g/mol). In Equation 1, 0.2 is a conversion factor. This conversion factor is a coefficient for converting the measured value in the case of assuming that the flow rate of pure $WCl_6$ gas is measured by using a mass flow meter calibrated with $N_2$ gas, into the flow rate of $WCl_6$.

After converting the unit of the flow rate of the $WCl_6$ gas into mg/min, the FPGA 111 calculates an integrated flow rate, which is a time integration of the instantaneous mass flow rate of the $WCl_6$ gas, and transmits the integrated flow rate to the MC 120. For example, the unit of the integrated flow rate is milligram (mg).

When supplying the mixed gas of $WCl_6$ gas, carrier $N_2$ gas, and dilution $N_2$ gas into the processing space 37, the opening/closing valves 95*a*, 95*b*, 96*a*, 96*b*, and 103 are opened and the opening/closing valves 99 and 105 are closed. The carrier $N_2$ gas is supplied from the carrier $N_2$ gas source 93 to the film-forming raw material tank 91 via the carrier gas pipe 92, and the $WCl_6$ gas sublimated in the film-forming raw material tank 91 and the carrier $N_2$ gas are supplied to the buffer tank 80 via $WCl_6$-containing gas supply line 61. At the same time, the dilution $N_2$ gas is supplied to the buffer tank 80 from the dilution $N_2$ gas source 101 via the dilution $N_2$ gas supply line 100A and the $WCl_6$-containing gas supply line 61. At this time, by opening the opening/closing valves 76 and 78 and closing the opening/closing valves 74, 75, 77, and 79, $N_2$ gas is continuously supplied into the processing space 37 from the first $N_2$ gas source 54 and the second $N_2$ gas source 55 via the first continuous $N_2$ gas supply line 66 and the second continuous $N_2$ gas supply line 68. Then, by opening the opening/closing valve 73, the mixed gas of $WCl_6$ gas, carrier $N_2$ gas, and dilution $N_2$ gas in the buffer tank 80 is supplied into the processing space 37 via the confluent pipe 72 and the gas introduction hole 36. At this time, the FPGA 111 calculates the flow rate of the $WCl_6$ gas by subtracting the measured flow rate value of the carrier $N_2$ gas, which is acquired from the MFC 94, and the measured flow rate value of the dilution $N_2$ gas, which is acquired from the MFC 102, from the measured flow rate value of the mixed gas of the $WCl_6$ gas, the carrier $N_2$ gas, and the dilution $N_2$ gas, which is acquired from the MFM 97, and transmits the calculated flow rate of the $WCl_6$ gas to the MC 120. The process of supplying the mixed gas of the $WCl_6$ gas, the carrier $N_2$ gas, and the dilution $N_2$ gas into the processing space 37 in this way corresponds to step S1 which will be described later with reference to FIG. 3.

The MC 120 includes a process controller including a microprocessor (computer) configured to control each component, specifically an opening/closing valve, a power supply, a heater, a pump, or the like as well as a user interface and a storage. Each component of the film-forming apparatus 100 is electrically connected to the process controller. The user interface is connected to the process controller, and includes a keyboard with which an operator performs an operation to input commands to control each component of the film-forming apparatus 100, a display configured to visualize and display an operation situation of each component of the film-forming apparatus 100, and the like. The storage is also connected to the process controller. The storage stores control programs that implement various processes executed by the film-forming apparatus 100 under the control of the process controller, and control programs that cause each component of the film-forming apparatus 100 to execute a predetermined process according to processing conditions, that is, processing recipes, various databases, and the like. The storage stores a pressure within the buffer tank 80 when a $WCl_6$-containing gas was supplied into the processing container 1 to perform a process previously for each processing recipe. The processing recipes are stored in a storage medium (not illustrated) in the storage. The storage medium may be a fixed one such as a hard disk, or may be a portable one such as a CDROM, a DVD, or a semiconductor memory. Further, the recipes may be appropriately transmitted from another device via, for example, a dedicated line. If necessary, a predetermined processing recipe is called from the storage by an instruction from the user interface or the like and executed by the process controller, such that a desired process in the film-forming apparatus 100 is performed under the control of the process controller.

<Gas Supply Method in Film-Forming Apparatus>

Next, a gas supply method in the film-forming apparatus 100 will be described by taking as an example the case where a tungsten film is formed by using the above-described film-forming apparatus 100 (a film-forming method). The gas supply method according to the present embodiment is applied to a case where a tungsten film is formed on a wafer W in which a base film is formed on a surface of a silicon film having a recess such as a trench, a hole, or the like.

FIG. 2 is a flowchart illustrating an example of a film-forming method according to the present embodiment.

First, a wafer W is carried into the processing container 1 (step S11: carry-in step). Specifically, the gate valve 12 is opened in a state where the susceptor 2 is lowered to the transport position, and the wafer W is carried into the processing container 1 via the carry-in/out port 11 by a transport apparatus (not illustrated) and placed on the susceptor 2 heated to a predetermined temperature by the heater 21. Subsequently, the susceptor 2 is raised to the processing position, and the interior of the processing container 1 is depressurized to a predetermined degree of vacuum. Thereafter, the opening/closing valves 76 and 78 are opened, and the opening/closing valves 73, 74, 75, 77, and 79 are closed. As a result, $N_2$ gas is supplied into the processing container 1 from the first $N_2$ gas source 54 and the second $N_2$ gas source 55 via the first continuous $N_2$ gas supply line 66 and the second continuous $N_2$ gas supply line 68 to raise the pressure in the processing container 1 and to stabilize a temperature of the wafer W on the susceptor 2. At this time, the $WCl_6$-containing gas is supplied into the buffer tank 80 from the film-forming raw material tank 91, and the pressure in the buffer tank 80 is maintained approximately constant. As the wafer W, a wafer in which a base film is formed on the surface of a silicon film having a recess such as a trench or a hole may be used. Examples of the base film include titanium-based material films such as a TiN film, a TiSiN film, a Ti silicide film, a Ti film, a TiO film, and a TiAlN film. Examples of the base film further include tungsten-based compound films such as a WN film, a $WSi_x$ film, and a WSiN film. By providing the base film on the surface of the silicon film, it is possible to form a tungsten film with good adhesion. Further, it is possible to shorten an incubation time.

Next, the tungsten film is formed by using the $WCl_6$-containing gas, which is a metal chloride-containing gas, and $H_2$ gas, which is a reducing gas (step S12: film-forming step). The film-forming step is performed after the pressure in the buffer tank 80 is adjusted to a second pressure in an adjustment step.

<Gas Supply Sequence in Film-Forming Step>

Figure 3:
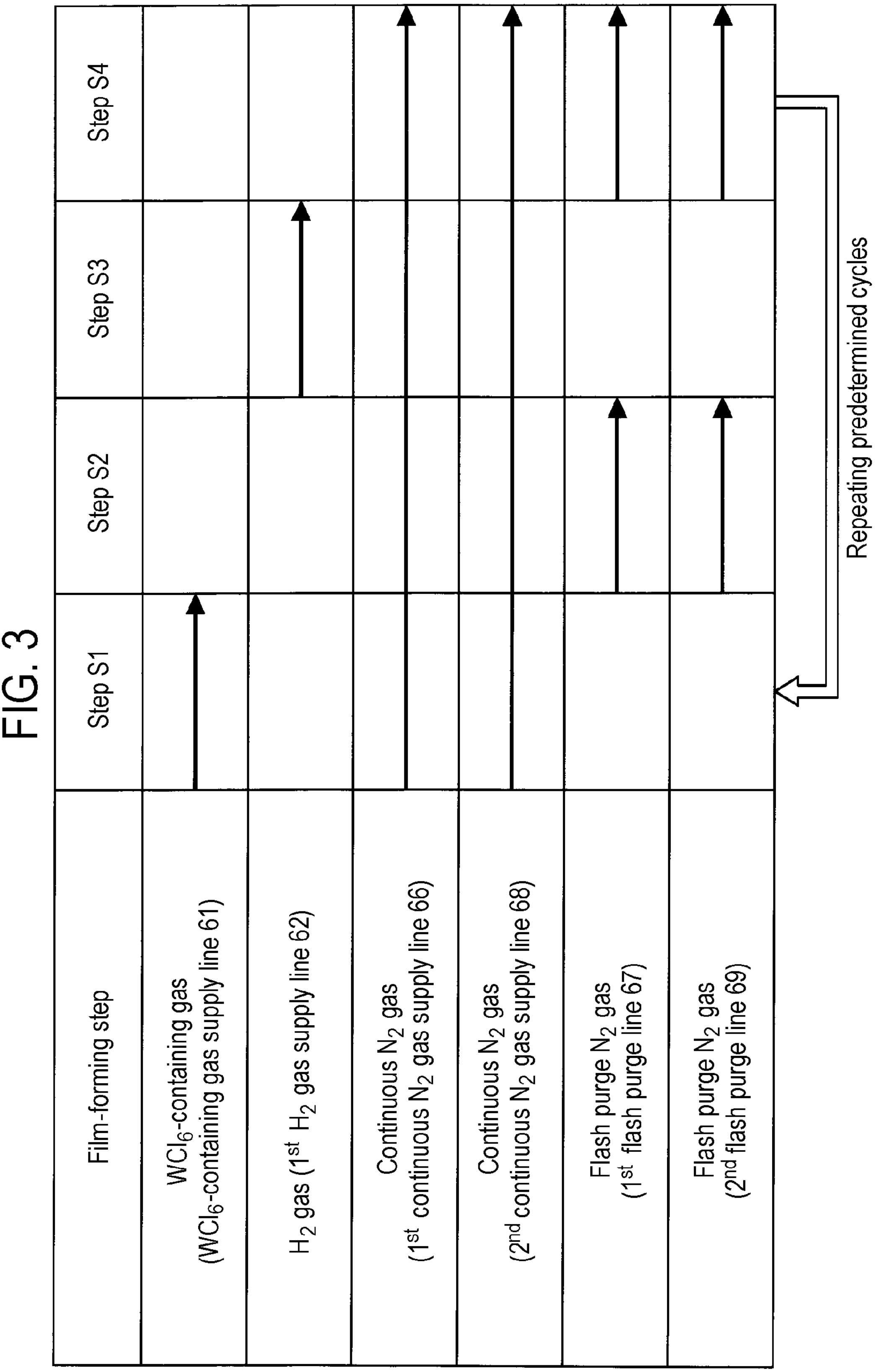
FIG. 3 is a diagram illustrating an example of a gas supply sequence in a film-forming step of the film-forming method according to the present embodiment.

FIG. 3 is a diagram illustrating an example of a gas supply sequence in the film-forming step of the film-forming method according to the present embodiment. One cycle of the film-forming step by an ALD method includes steps S1 to S4 represented below.

Step S1 is a raw material gas supply step of supplying the $WCl_6$-containing gas to the processing space 37. In step S1, first, in a state where the opening/closing valves 76 and 78 are opened, $N_2$ gas is continuously supplied from the first $N_2$ gas source 54 and the second $N_2$ gas source 55 via the first continuous $N_2$ gas supply line 66 and the second continuous $N_2$ gas supply line 68. Further, by opening the opening/closing valve 73, the $WCl_6$-containing gas is supplied from the $WCl_6$-containing gas supply mechanism 51 to the processing space 37 in the processing container 1 via the $WCl_6$-containing gas supply line 61. At this time, the $WCl_6$-containing gas is first stored in the buffer tank 80 and then supplied into the processing container 1. In step $S_1$, $H_2$ gas as an additive reducing gas may be supplied into the processing container 1 via the second $H_2$ gas supply line 63 extending from the second $H_2$ gas source 53. By supplying the reducing gas at the same time as the $WCl_6$-containing gas in step S1, the supplied $WCl_6$-containing gas is activated, such that the subsequent film-forming reaction in step S3 is likely to occur. Therefore, it is possible to maintain a high step coverage and increase a deposition film thickness per cycle such that a film-forming rate may be increased. The flow rate of the additive reducing gas may be set to such a flow rate that a chemical vapor deposition (CVD) state does not occur in step S1.

Step S2 is a purge step of purging excess $WCl_6$-containing gas or the like in the processing space 37. In step S2, in a state where the $N_2$ gas is continuously supplied via the first continuous $N_2$ gas supply line 66 and the second continuous $N_2$ gas supply line 68, the opening/closing valve 73 is closed to stop the $WCl_6$-containing gas. Further, by opening the opening/closing valves 77 and 79 and supplying $N_2$ gas (flash purge $N_2$ gas) from the first flash purge line 67 and the second flash purge line 69 as well, excess $WCl_6$-containing gas in the processing space 37 is purged with the $N_2$ gas of a large flow rate.

Step S3 is a reducing gas supply step of supplying $H_2$ gas to the processing space 37. In step S3, by closing the opening/closing valves 77 and 79, the $N_2$ gas from the first flash purge line 67 and the second flash purge line 69 is stopped. Further, in a state where the supply of $N_2$ gas via the first continuous $N_2$ gas supply line 66 and the second continuous $N_2$ gas supply line 68 is continued, the opening/closing valve 74 is opened. As a result, $H_2$ gas as a reducing gas is supplied from the first $H_2$ gas source 52 to the processing space 37 via the first $H_2$ gas supply line 62. At this time, the $H_2$ gas is once stored in the buffer tank 81 and then supplied into the processing container 1. In step S3, $WCl_6$ adsorbed on the wafer W is reduced. The flow rate of the $H_2$ gas at this time may be set to cause a sufficient reducing reaction.

Step S4 is a purge step of purging excess $H_2$ gas in the processing space 37. In step S4, in the state where the supply of $N_2$ gas via the first continuous $N_2$ gas supply line 66 and the second continuous $N_2$ gas supply line 68 is continued, the supply of $H_2$ gas from the first $H_2$ gas supply line 62 is stopped by closing the opening/closing valve 74. In addition, by opening the opening/closing valves 77 and 79 to supply $N_2$ gas (flash purge $N_2$ gas) from the first flash purge line 67 and the second flash purge line 69 as well, excess $H_2$ gas in the processing space 37 is purged with the $N_2$ gas of a large flow rate in the similar manner to the step 2.

By performing one cycle of the above-described steps S1 to S4 in a short time, a thin tungsten unit film is formed, and by repeating the cycle of these steps a plurality of times, a tungsten film having a desired film thickness is formed. It is possible to control the film thickness of the tungsten film at this time by the number of repetitions of the above-mentioned cycle. In the present embodiment, the case where the carry-in step, the depressurizing step, the adjustment step, and the film-forming step are performed in this order has been described as an example, but the carry-in step and the depressurizing step may be performed at the same time.

<Change in Flow Rate of $WCl_6$ Gas Over Time>

When calculating the supply amount of $WCl_6$ gas to the processing container 1, the flow rate of $WCl_6$ gas calculated by the controller 300 immediately after the start of film formation may be inaccurate. Here, a case where the calculated flow rate of the $WCl_6$ gas becomes an inaccurate value will be described with reference to FIG. 4.

Figure 4:
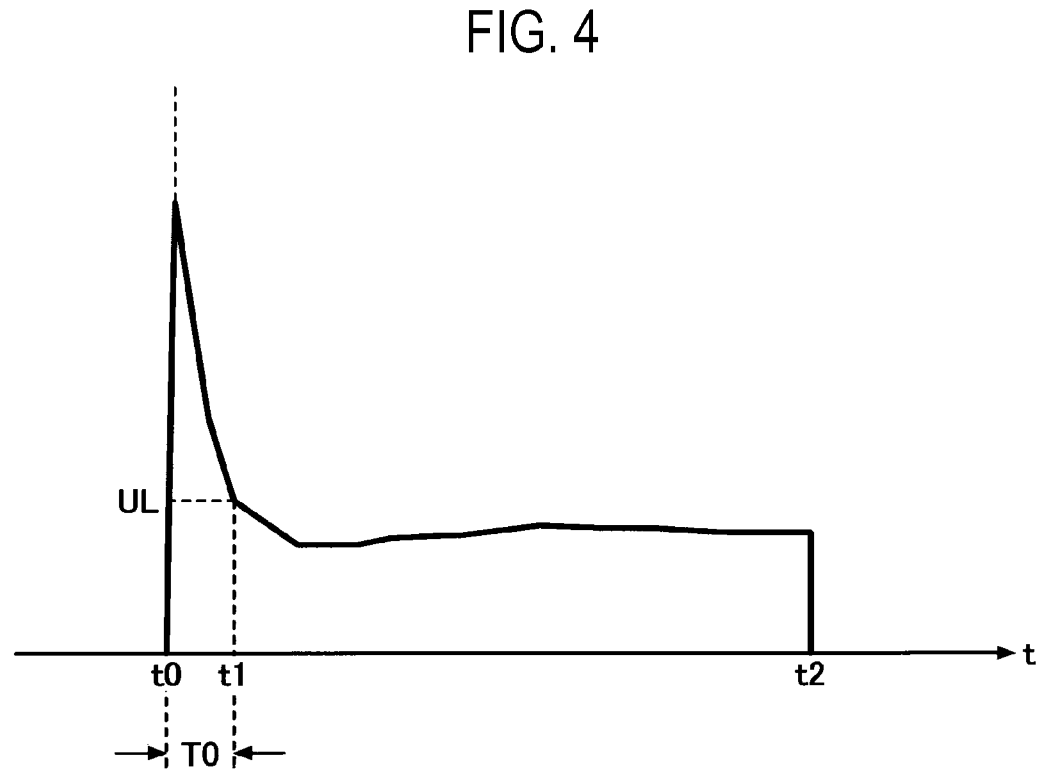
FIG. 4 is a diagram illustrating an example of change in a flow rate of $WCl_6$ gas calculated by a controller over time.

FIG. 4 is a diagram illustrating an example of the change in the calculated flow rate value of $WCl_6$ gas calculated by the controller 300 over time. In FIG. 4, the horizontal axis represents the time t, and the vertical axis represents the calculated flow rate value of $WCl_6$ gas. The calculated flow rate value of $WCl_6$ gas is calculated by subtracting the measured flow rate value of carrier $N_2$ gas measured by using the MFC 94 and the measured flow rate value of dilution $N_2$ gas by using the MFC 102 from the measured flow rate value of the mixed gas of $WCl_6$ gas, carrier $N_2$ gas, and dilution $N_2$ gas measured by using the MFM 97.

Time t=t0 is the time at the start of film formation by an ALD method. The film-forming process is completed at time t=t2. In the film-forming process from time t=t0 to time t=t2, for example, the film-forming step by the ALD method is performed 100 cycles.

For example, the processing time for one cycle is 1 second. The MFM 97, the MFC 94, and the MFC 102 measure the flow rates multiple times during the period of one cycle. The controller 300 acquires the flow rate measurement value of the mixed gas of $WCl_6$ gas, carrier $N_2$ gas, and dilution $N_2$ gas measured by the MFM 97. The controller 300 acquires the measured flow rate value of the carrier $N_2$ gas measured by the MFC 94. The controller 300 acquires the measured flow rate value of the dilution $N_2$ gas measured by the MFC 102.

Here, for example, since the sampling cycle of the MFM 97, the MFC 94, and the MFC 102 is 100 milliseconds, the sampling is performed 10 times during the period of one cycle. Further, 100 cycles is an example, and the number of cycles may be less or more than 100. The time required for one cycle may be shorter or longer than 1 second. The sampling cycle of 100 milliseconds is an example, and may be shorter or longer than 100 milliseconds. The sampling cycle may be any sampling as long as the sampling is performed a plurality of times in one cycle.

During the period T0 immediately after the start of film formation at time t=t0, the calculated flow rate value of $WCl_6$ gas increased in a spike shape and exceeded the upper limit UL of the normal value of the calculated flow rate value of $WCl_6$ gas. Further, the set flow rate value of carrier $N_2$ gas in the MFC 94 is constant. Further, the set flow rate value of dilution $N_2$ gas in the MFC 102 is constant.

The period T0 is a period from time t=t0 to time t=t1, and for example, it is a period of 5 cycles from the start of film formation. The calculated flow rate value of $WCl_6$ gas exceeds the upper limit UL of the normal value of the calculated flow rate value of $WCl_6$ gas over the period T0. The upper limit UL of the normal value of the calculated flow rate value of $WCl_6$ gas is an upper limit value obtained by adding a tolerance to the set value of the flow rate of $WCl_6$ gas specified in the processing recipe. For example, the start (time t=t0) and the end (time t=t1) of the period T0 may be measured in advance by the film-forming apparatus 100.

Here, the reason that the calculated flow rate value of $WCl_6$ gas increases during the period T0 immediately after the start of film formation will be described.

In a case where it is possible to measure a true flow rate of the $N_2$ gas in a mixed gas of $WCl_6$ and $N_2$ flowing through the MFM 97 and it is possible to subtract a true flow rate of the $N_2$ gas flowing through the MFM 97 from the flow rate of the mixed gas of $WCl_6$ and $N_2$ flowing through the MFM 97, it is possible to measure a correct flow rate of the $WCl_6$ gas flowing through the MFM 97.

However, it is difficult to measure the true flow rate of $N_2$ gas flowing through the MFM 97. The total value of the flow rate of $N_2$ flowing through the MFC 94 and the flow rate of $N_2$ flowing through the MFC 102 is regarded as an approximation of the true flow rate of $N_2$ gas flowing through the MFM 97, and the estimated value of $WCl_6$ gas flowing through the MFM 97 is obtained by subtracting the approximation from the flow rate of the mixed gas of $WCl_6$ and $N_2$ flowing through the MFM 97.

Immediately after the start of film formation on one wafer W, a mixed ratio of the $WCl_6$ and the $N_2$ in the mixed gas of $WCl_6$ and $N_2$ flowing through the MFM 97 may be in the state in which an amount of the $WCl_6$ gas is small and an amount of the $N_2$ gas is large compared to the mixed ratio estimated from the set flow rate value of the processing recipe and the like.

Immediately after the start of film formation, the $N_2$ gas flowing out from the carrier $N_2$ gas source 93 or the dilution $N_2$ gas source 101 is not the only gas that flows into the MFM 97. The $N_2$ gas that existed in the film-forming raw material tank 91 and in a pipe near the same before the start of film formation also flows into the MFM 97. One of estimated reasons that the mixed ratio of $WCl_6$ and $N_2$ in the mixed gas fluctuates is that the $N_2$ gas that existed in the film-forming raw material tank 91 and a pipe near the same before the start of film formation flows into the MFM 97.

When the mixed ratio of $WCl_6$ and $N_2$ fluctuates based on the mixed ratio of $WCl_6$ and $N_2$ estimated from the set flow rate values of the processing recipe, the calculated flow rate of $WCl_6$ gas may become larger.

As a result, there occurs a phenomenon in which the flow rate of $WCl_6$ gas calculated by the controller 300 becomes larger than the true flow rate of $WCl_6$ gas within the period T0 immediately after the start of film formation.

In this way, when the supply amount of $WCl_6$ gas to the processing container 1 is controlled by using an inaccurate calculated flow rate value of $WCl_6$ gas in the period T0 immediately after the start of film formation, there is a possibility that the $WCl_6$ in the film-forming raw material tank 91 will remain without being used up. In particular, when an expensive solid raw material is used, it is desired to use all of the raw material up to the end, so it is desired to accurately determine the supply amount to the processing container 1.

<Calculation Method of Integrated Flow Rate>

Figure 5:
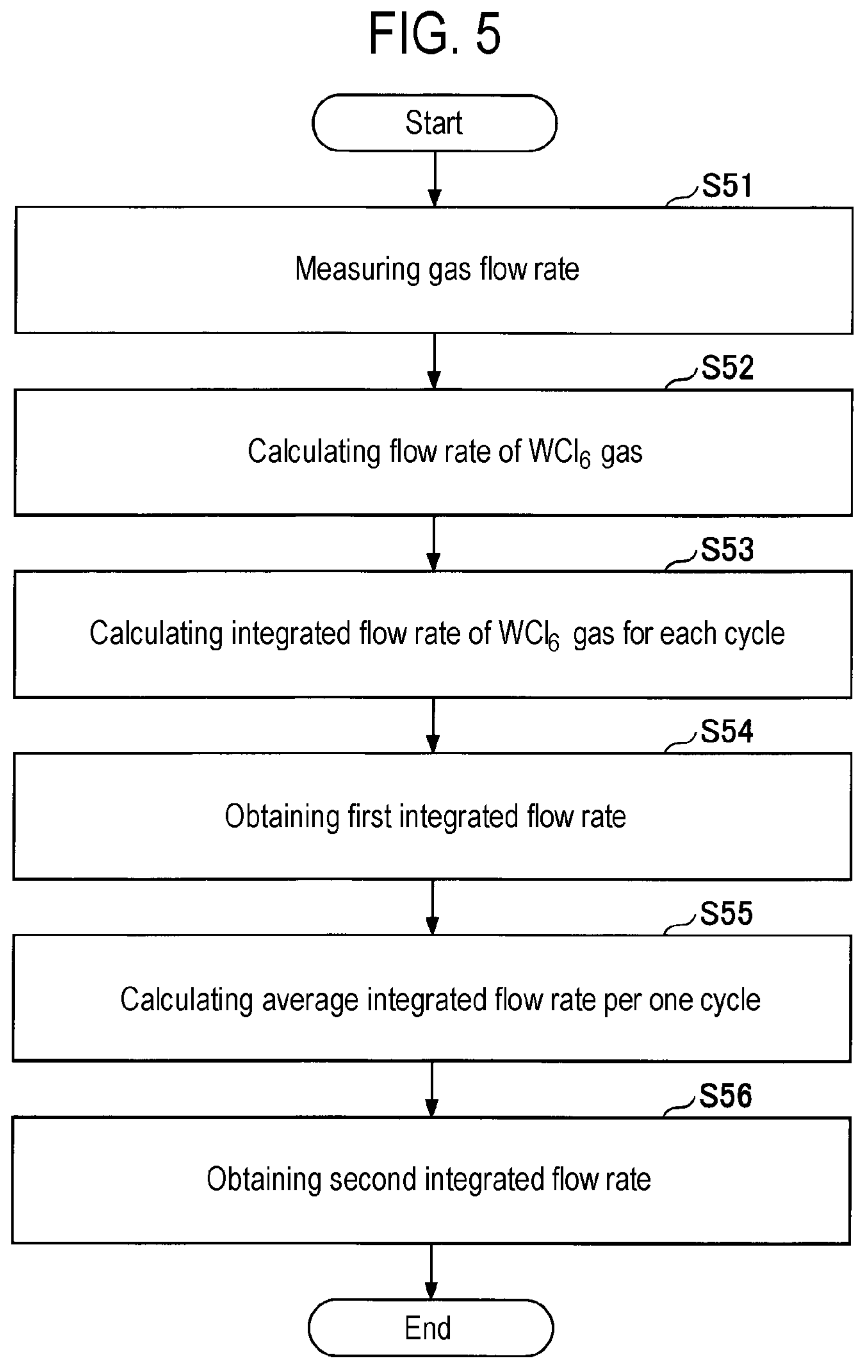
FIG. 5 is a flowchart illustrating an example of a process of a gas supply amount calculation method of an embodiment.

Therefore, the controller 300 performs the following correction process. FIG. 5 is a flowchart illustrating an example of processes of a gas supply amount calculation method of an embodiment.

The processes of steps S51 to S54 are processes performed from the start to the completion of film formation on one wafer W. For example, the processes of steps S55 to S57 are processes performed after the film formation on one wafer W is completed.

(Step S51: Step of Measuring Gas Flow Rate)

The controller 300 measures the flow rate of carrier $N_2$ gas by using the MFC 94. The controller 300 measures the flow rate of dilution $N_2$ gas by using the MFC 102. The controller 300 measures the flow rate of a mixed gas of $WCl_6$ gas, carrier $N_2$ gas, and dilution $N_2$ gas by using the MFM 97.

(Step S52: Step of Calculating Flow Rate of $WCl_6$ Gas)

The FPGA 111 calculates the flow rate of the $WCl_6$ gas by subtracting the flow rate of the carrier $N_2$ gas measured by the MFC 94 and the flow rate of the dilution $N_2$ gas measured by the MFC 102 from the flow rate of the mixed gas of the $WCl_6$ gas, the carrier $N_2$ gas, and the dilution $N_2$ gas measured by the MFM 97.

(Step S53: Step of Calculating Integrated Flow Rate of $WCl_6$ Gas for Each Cycle)

The FPGA 111 calculates the integrated flow rate of the $WCl_6$ gas in each ALD cycle (IFCn: n is an integer of 1 or more and is a number that identifies the ALD cycle) by integrating the flow rate of the $WCl_6$ gas over time.

After calculating the integrated flow rate IFCn of the $WCl_6$ gas for each cycle, the FPGA 111 and the MC 120 transmit the integrated flow rate IFCn for each cycle from the FPGA 111 to the MC 120.

(Step S54: Step of Obtaining First Integrated Flow Rate)

The MC 120 obtains the first integrated flow rate IF1 by adding the integrated flow rate IFCn for each cycle of the $WCl_6$ gas for the cycles included in the period from the time at which the period T0 elapses from the start of film formation to the completion of film formation.

Assuming that the number of cycles included in the period T0 is Ca and the number of cycles included in the period from the time at which the period T0 elapses from the start of film formation to the completion of film formation is Cb, Ca+1≤n≤Ca+Cb is established for n of IFCn to be added.

$$IF1 = \sum IFCn(Ca + 1 \leq n \leq Ca + Cb) \quad \text{(Equation 2)}$$

(Step S55: Step of Calculating Average Integrated Flow Rate Per Cycle)

The MC 120 calculates the average integrated flow rate per cycle (AVE) by dividing the first integrated flow rate IF 1 by the number of cycles Cb included in the period from the time at which the period T0 elapses from the start of film formation to the completion of film formation.

$$AVE = IF1 / Cb \quad \text{(Equation 3)}$$

(Step S56: Step for Obtaining Second Integrated Flow Rate)

The MC 120 obtains the second integrated flow rate IF2 by adding the first integrated flow rate IF1 to a first multiplication value M1 obtained by multiplying the average integrated flow rate AVE by the number of cycles Ca included in the period T0.

$$M1 = AVE \times Ca \quad \text{(Equation 4)}$$

$$IF2 = M1 + IF1 = AVE \times Ca + IF1 = (IF1 / Cb) \times Ca + IF1 \quad \text{(Equation 5)}$$

The second integrated flow rate IF2 is a value very close to the total supply amount of $WCl_6$ gas supplied to the processing space 37 when a tungsten film is formed on one wafer W.

Although the case where the FPGA 111 executes steps S52 and S53 has been described as an example, the MC 120 may execute steps S52 and S53. When the MC 120 executes all the steps of steps S52 to S56, the integrated flow rate IFCn for each cycle may not be transmitted from the FPGA 111 to the MC 120.

Although the case where the MC 120 executes steps S54 to S56 has been described as an example, the FPGA 111 may execute steps S54 to S56. When the FPGA 111 executes all the steps of steps S52 to S56, the integrated flow rate IFCn for each cycle may not be transmitted from the FPGA 111 to the MC 120.

Other elements different from the FPGA 111 and the MC 120 in the controller 300 may execute steps S52 to S56.

According to the method of the present disclosure, it is possible to provide a gas supply amount calculation method capable of accurately calculating the supply amount (total supply amount) of $WCl_6$ gas during the film formation by the ALD method. In a case where a semiconductor device is manufactured on a surface of a wafer W while controlling the supply amount of $WCl_6$ gas to the processing container 1 by using the total supply amount obtained as described above, it is possible to use all of the $WCl_6$ in the film-forming raw material tank 91. In particular, when an expensive solid raw material is used, it is possible to use up the raw material so that the cost required for film formation may be suppressed.

In addition, by using up the $WCl_6$ in the film-forming raw material tank 91, it is possible to reduce the number of replacements of the film-forming raw material tank 91 so that a throughput in the manufacture of a semiconductor device may be improved.

<Other Applications>

In the foregoing, a mode in which the solid raw material is tungsten hexachloride ($WCl_6$) has been described, but the solid raw material is not limited to the tungsten hexachloride ($WCl_6$). For example, tungsten pentachloride ($WCl_5$) may be used. The tungsten hexachloride ($WCl_6$) and the tungsten pentachloride ($WCl_5$) are solids at room temperature at atmospheric pressure.

Although the embodiments of the gas supply amount calculation method and the semiconductor device manufacturing method according to the present disclosure have been described above, the present disclosure is not limited to the above-described embodiments or the like. Various changes, modifications, substitutions, additions, deletions, and combinations may be made within the scope of the claims. Of course, these also fall within the technical scope of the present disclosure.

The present international application claims priority based on Japanese Patent Application No. 2020-058325 filed on Mar. 27, 2020, the disclosure of which is incorporated herein in its entirety by reference.

EXPLANATION OF REFERENCE NUMERALS

1: processing container, 2: susceptor, 2*a*: through-hole, 3: shower head, 4: exhaust, 5: processing gas supply mechanism, 11: carry-in/out port, 12: gate valve, 13: exhaust duct, 13*a*: slit, 13*b*: exhaust port, 14: ceiling wall, 15: seal ring, 21: heater, 22: cover member, 23: support member, 24, 28: lifting mechanism, 25: flange, 26: bellows, 27: wafer support pin, 27*a*: lifting plate, 31: main body, 32: shower plate, 33: gas diffusion space, 34: annular protrusion, 35: gas ejection hole, 36: gas introduction hole, 37: processing space, 38: annular gap, 41: exhaust pipe, 42: exhaust mechanism, 51: $WCl_6$-containing gas supply mechanism, 52: first $H_2$ gas source, 53: second $H_2$ gas source, 54: first $N_2$ gas source, 55: second $N_2$ gas source, 56: $SiH_4$ gas source, 61: $WCl_6$-containing gas supply line, 62: first $H_2$ gas supply Line, 63: second $H_2$ gas supply line, 63*a*: $SiH_4$ gas supply line, 64: first $N_2$ gas supply line, 65: second $N_2$ gas supply line, 66: first continuous $N_2$ gas supply line, 67: first flash purge line, 68: second continuous $N_2$ gas supply line, 69: second flash purge line, 70: first connection line, 71: second connection line, 72: confluent pipe, 73, 74, 75, 76, 77, 78, 79, 88, 88*a*, 95*a*, 95*b*, 96*a*, 96*b*, 99, 103, 105, 106: opening/closing valve, 80, 81: buffer tank, 80*a*: pressure gauge, 82, 83, 84, 85, 86, 87, 94, 102: MFC, 91: film-forming raw material tank, 91*a*: heater, 92: carrier gas piping, 93: carrier $N_2$ gas source, 97: MFM, 98: bypass pipe, 100: film-forming apparatus, 100A: dilution $N_2$ gas supply line, 101: dilution $N_2$ gas source, 104: evacuation line, 107: pressure control valve, 110: I/O board, 111: FPGA, 112: serial communication cable, 120: MC, 300: controller

What is claimed is:

1. A method of film formation by using an atomic layer deposition in a film-forming apparatus, method comprising:

supplying a mixed gas of a first substance gas and a second substance gas to a processing container of the film-forming apparatus which is configured to perform a plurality of cycles of the film formation, the first substance gas being obtained from a solid raw material accommodated in a raw material container of the film-forming apparatus, the raw material container being configured to sublimate the solid raw material to obtain the first substance gas;

supplying a reducing gas to the processing container;

performing a gas supply amount calculation method comprising:

calculating a flow rate of the first substance gas by subtracting a flow rate of the second substance gas from a flow rate of the mixed gas, the flow rate of the mixed gas being measured by a first flow meter of the film-forming apparatus, and the flow rate of the second substance gas being measured by one or more second flow meters of the film-forming apparatus;

calculating a first integrated flow rate of the first substance gas by integrating the calculated flow rate of the first substance gas over time in cycles excluding a predetermined number of cycles immediately after start of the film formation among the plurality of cycles of the film formation;

calculating an average integrated flow rate of the first substance gas per cycle by dividing the first integrated flow rate by the number of the cycles excluding the predetermined number of cycles; and calculating a total supply amount of the first substance gas in the plurality of cycles of the film formation by adding the first integrated flow rate and a multiplication value obtained by multiplying the average integrated flow rate by the predetermined number; and controlling a supply amount of the first substance gas to the processing container based on the calculated total supply amount such that the solid raw material accommodated in the raw material container is used up, wherein the predetermined number of cycles immediately after the start of the film formation corresponds to a period during which the calculated flow rate of the first substance gas exceeds an upper limit of a normal value of the calculated flow rate of the first substance gas, the normal value being a set value of the flow rate of the first substance gas, the set value being specified in a processing recipe, which is stored in a storage of the film-forming apparatus.

2. The method of claim 1, wherein the first flow meter is installed at a first flow path that interconnects the raw material container and the processing container.

3. The method of claim 2, wherein an entire amount of the second substance gas flowing through each of the second flow meters flows into the first flow meter.

4. A semiconductor device manufacturing method, wherein a semiconductor device is manufactured by using the total supply amount calculated by the gas supply amount calculation method performed in the method of claim 3.

5. A semiconductor device manufacturing method, wherein a semiconductor device is manufactured by using the total supply amount calculated by the gas supply amount calculation method performed in the method of claim 1.

* * * * *